United States Patent [19]
Larsen

[11] Patent Number: 5,964,552
[45] Date of Patent: Oct. 12, 1999

[54] METHOD AND CUTTING INSERT FOR CUTTING SCREW THREADS IN METAL WORK PIECES

[75] Inventor: Staffan Larsen, Ludvika, Sweden

[73] Assignee: Seco Tools AB, Fagersta, Sweden

[21] Appl. No.: 08/875,179

[22] PCT Filed: Jan. 17, 1996

[86] PCT No.: PCT/SE96/00032

§ 371 Date: Sep. 8, 1997

§ 102(e) Date: Sep. 8, 1997

[87] PCT Pub. No.: WO96/22172

PCT Pub. Date: Jul. 25, 1996

[30] Foreign Application Priority Data

Jan. 19, 1995 [SE] Sweden .................................. 9500166

[51] Int. Cl.[6] .................................................. B23B 27/16
[52] U.S. Cl. ............................................. 407/113; 407/114
[58] Field of Search ..................... 82/1.11, 110; 407/113, 407/114; 470/66, 84

[56] References Cited

U.S. PATENT DOCUMENTS

| | | |
|---|---|---|
| 3,813,746 | 6/1974 | Price .............................................. 29/96 |
| 4,278,370 | 7/1981 | Spear . |
| 4,281,430 | 8/1981 | Hellnick .................................. 407/113 |
| 4,505,626 | 3/1985 | Benhase .................................. 408/224 |
| 4,575,888 | 3/1986 | Muren . |
| 4,674,924 | 6/1987 | Carlsson et al. ........................ 407/114 |

FOREIGN PATENT DOCUMENTS

| | | |
|---|---|---|
| 2 252 895 | 6/1975 | France . |
| WO95/07159 | 3/1995 | WIPO . |

*Primary Examiner*—Andrea L. Pitts
*Assistant Examiner*—Mark Williams
*Attorney, Agent, or Firm*—Burns, Doane, Swecker & Mathis, L.L.P.

[57] ABSTRACT

A thread-cutting insert includes a body and a cutting tip projecting therefrom. The cutting tip includes: a cutting edge formed by a nose edge at a front end of the cutting tip, an active cutting edge disposed on one side of a bisector of the cutting tip, and a passive edge disposed on the other side of the bisector. One thread flank is cut in a workpiece by the active cutting edge. The other thread flank is cut by the nose edge. The passive cutting edge extends rearwardly from the nose edge and is recessed inwardly from the thread flank being cut by the nose edge.

12 Claims, 5 Drawing Sheets

METHOD AND CUTTING INSERT FOR CUTTING SCREW THREADS IN METAL WORK PIECES

BACKGROUND OF THE INVENTION

The present invention relates to a method and a cutting insert for threading. The method aims to produce a thread in a rotary work piece, wherein a threading insert, including at least one cutting tip, creates the shape of the thread through a number of passes along the work piece. The threading insert aims to create threads including two thread flanks in a work piece, by flank infeed and comprises at least one cutting tip provided with cutting edges.

PRIOR ART

In known indexable threading inserts the cutting tip is in top view identical with the profile of the finished the thread, which means that at flank infeed, wear develops on the passive flank of the cutting tip due to abrasion from the work piece. Thereby these cutting inserts can not attain optimal tool life or reduce the time for processing at threading. At flank infeed a chip is obtained with rectangular cross section, which is easy to shape and handle in comparison with a chip from radial infeed, when the chip assumes a rigid V-shaped cross section. This fact together with a more efficient heat deduction from the cutting tip makes it possible to work with bigger chip thickness and to complete the thread with the same number of passes as by radial infeed. When conventional threading inserts are fed inwardly, parallel with one flank of the thread, the cutting edge facing said flank will not perform any cutting work but will only drag along said flank; something which can have an abrasive effect on the cutting edge and which can give bad surface finish on the thread flank. One has tried to feed the cutting tip at an angle which is smaller than the flank angle to avoid these negative effects, but then chips obtained from the side of the minor cutting edge have been thin and entangled, which has influenced tool life and surface finish.

OBJECTS OF THE INVENTION

One object of the present invention is to provide a cutting insert for flank infeed, which has good tool life.

Another object of the present invention is to provide a cutting insert for flank infeed, which reduces the time for processing at threading.

Another object of the present invention is to provide a cutting insert for flank infeed, which requires less energy to cut.

Still another object of the present invention is to provide a method for flank infeed, which gives good production economy.

DESCRIPTION OF THE DRAWINGS

FIG. 3 is similar to FIG. 3 but references additional characteristics of the insert tip.

DETAILED DESCRIPTION OF PREFERRED EMBODIMENTS OF THE INVENTION

Figure 1:
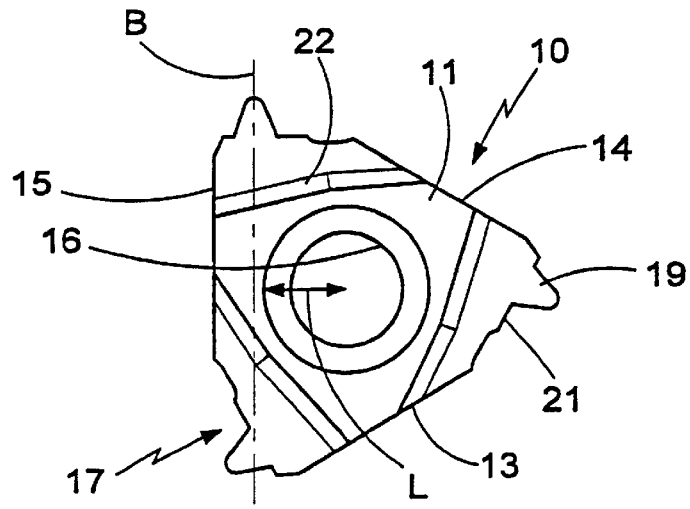
FIG. 1 shows a threading insert according to the present invention in a top view.
Figure 2:
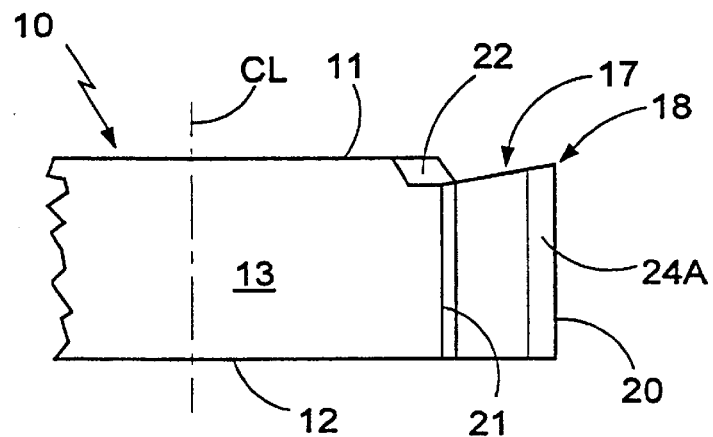
FIG. 2 shows the threading insert, in a side view.
Figure 9:
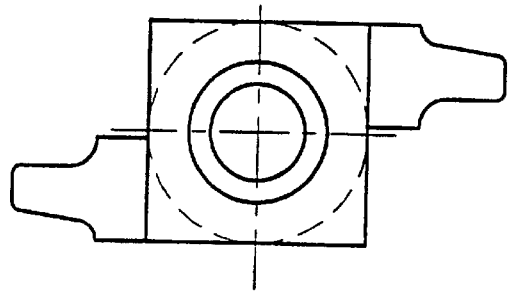
Figure 12:
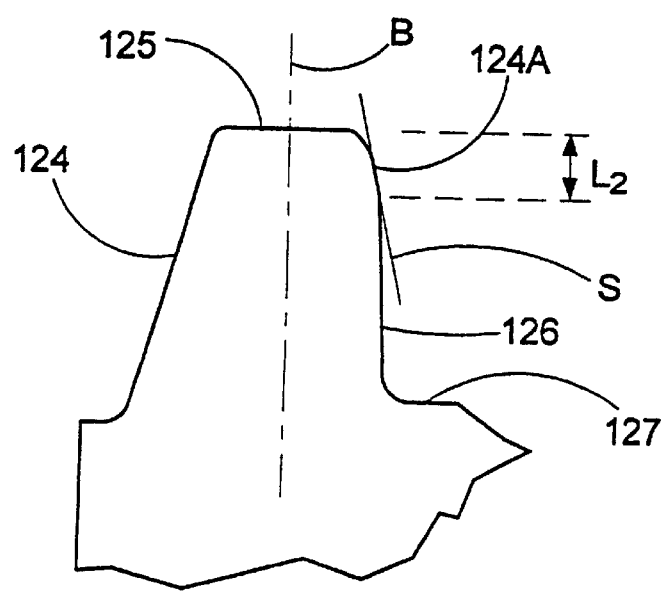
FIG. 12 shows the tip of the threading insert according to FIG. 9.

With reference to FIGS. 1 and 2 a cutting insert according to the present invention is designated by 10. The cutting insert preferably is made by coated cemented carbide. The cutting insert has a substantially triangular basic shape and comprises an upper and a lower side 11 and 12 respectively. The basic shape can also be square for example, such as is shown in FIG. 9. The sides 11 and 12 connect substantially perpendicularly to side surfaces 13, 14 and 15. The side surfaces form an acute angle of about 60° with each other. The cutting insert has a central hole 16 for receiving a fastening device for clamping of the cutting insert against a cutting insert pocket of a holder, not shown. The cutting insert is provided with three substantially identical cutting corners 17 in the areas for the imaginary intersection of the side surfaces. The cutting insert corner 17 comprises a cutting tip 18, a cutting edge which runs along the intersection between a chip surface 19 and a clearance surface 20, a topping surface 21 and a broken chip breaker rim 22. The cutting insert has a center axis CL and each cutting tip 18 has a bisector B. The bisector is substantially parallel with the associated edge surface 15 and extends on the side of the center axis at a distance L. The distance is 10 to 30% of the imaginary edge length of the cutting insert.

Figure 3:
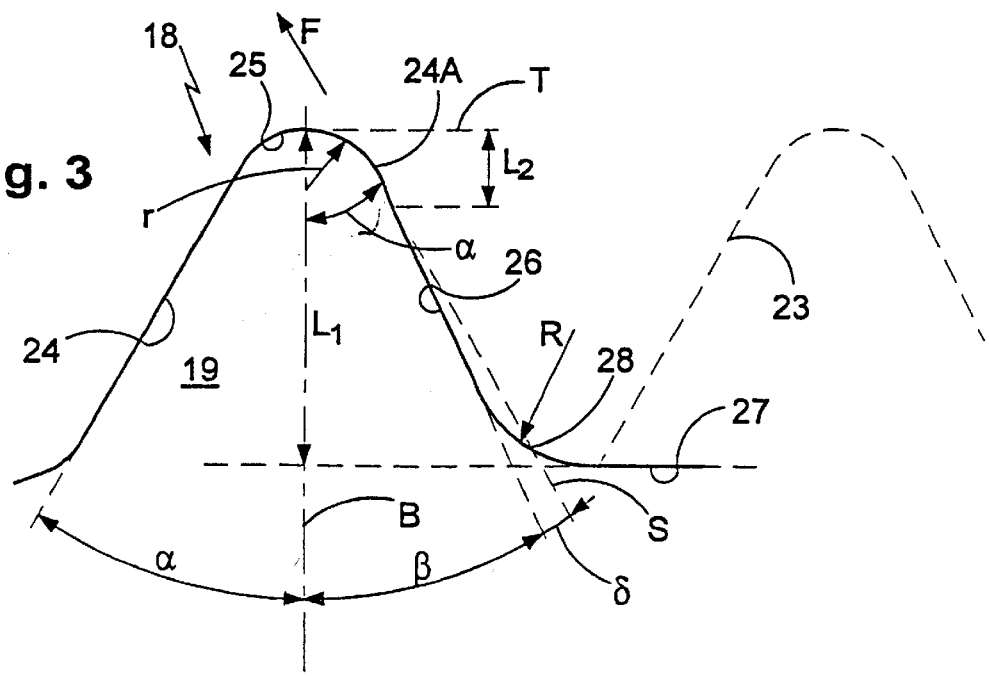
FIG. 3 shows the tip of the threading insert in engagement with a dashed work piece.

In FIG. 3 an enlarged cutting corner is shown, which engages a work piece, the thread 23 of which is dashed. The cutting edge consists of a number of segments and includes an active major cutting edge 24, a nose edge 25, an active minor cutting edge 24A, a passive edge 26 and a topping edge 27. The cutting tip 18 of the cutting corner projects a distance $L_1$, measured from a line touching the topping surface 27 to the extreme tip of the nose edge 25. The major cutting edge is provided on one side of the bisector and the minor cutting edge on the other side of the bisector while the nose edge cutting intersects the bisector. The major cutting edge 24 forms an acute angle $\alpha$, of about 25 to 30°, with the bisector B. The major cutting edge softly connects to the nose edge 25, which substantially is defined by a radius r, of about 0.05 to 1.5 mm. The nose edge further softly connects preferably to the active minor cutting edge 24A or directly to the passive cutting edge 26. The minor cutting edge connects to the passive cutting edge at a the perpendicular distance $L_2$ from a tangent T of the nose edge in the extreme points of the nose edge. The distance $L_2$ is bigger than or the same as the maximum depth of infeed per pass, but less than the half of the distance $L_1$ and preferably less than 2.5 mm and is preferably of the size of the radius r. Also the minor cutting edge or the part of the nose edge which is closest to the passive cutting edge forms the angle $\alpha$ with the bisector. The passive cutting edge 26 forms an angle $\beta$ with the bisector, which is smaller than the angle $\alpha$ by an angle $\delta$. The angle $\delta$ is 4 to 8°, preferably about 5°, less than the angle $\alpha$. The passive cutting edge connects to the topping edge 27 via a concave substantially passive, curved edge 28, defined by a radius R, the size of which depends on the actual thread profile but the radius r is bigger than the radius of the nose edge. The cutting tip thus has a passive edge 26, which at least partly is provided on one side of an imaginary line S extending parallel with the direction of infeed F for the cutting insert and touching the cutting tip 18, said side facing away from the connected thread flank 23. The line S touches the nose edge 25 as well as intersects the curved cutting edge 28.

From the foregoing, it will be appreciated that the nose edge 25 constitutes a first portion of the cutting edge. A section of that first portion 25 is disposed to the right side of the bisector in FIG. 3 and is adapted to cut one thread flank 23A. The active cutting edge 24 constitutes a second portion of the cutting edge disposed on the left side of the bisector and is adapted to cut another thread flank. The passive edge 26 constitutes a third portion of the cutting edge and extends rearwardly from a rear end of the first portion 25 recessed inwardly with respect to the imaginary reference line S.

Figure 3A:
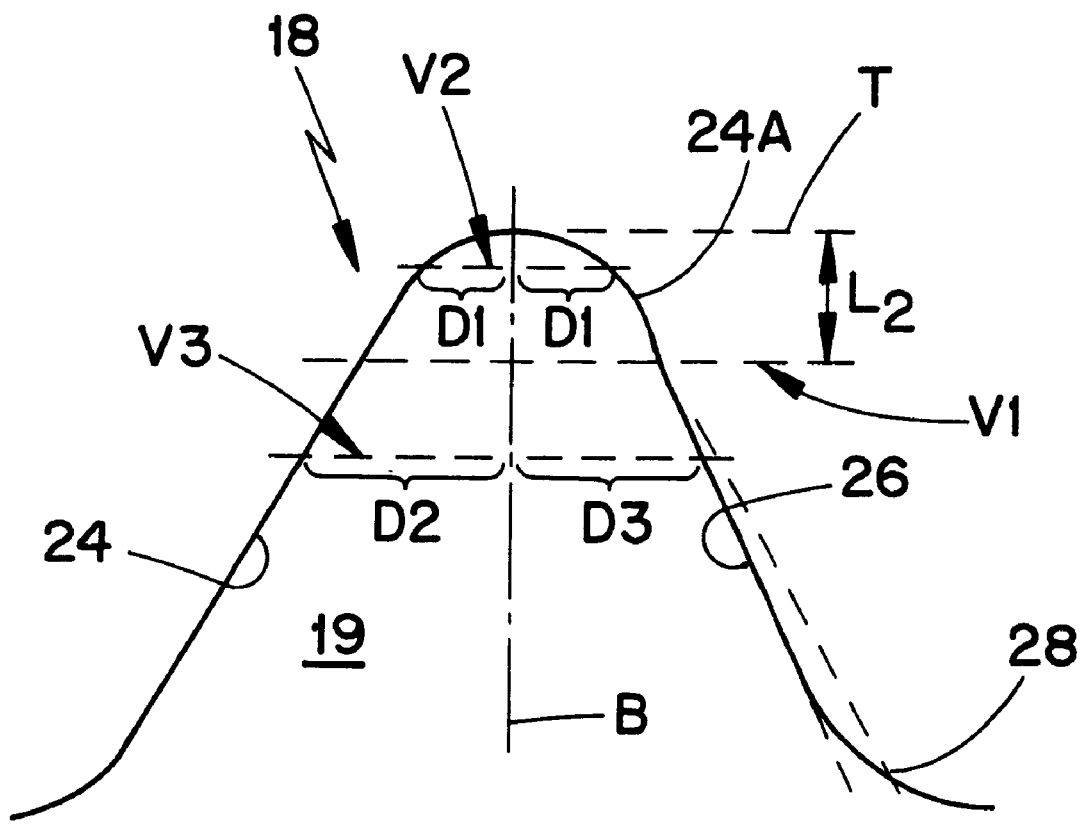

As shown in FIG. 3A, first line V1 extending perpendicular to the bisector B and passing through an intersection between the first and third portions 25 and 26 divides the cutting tip into forward and rearward portions. A second line V2 oriented perpendicular to the bisector B within the forward portion intersects the cutting edge at two locations spaced by equal distances D1 from the bisector B. A third line V3 oriented perpendicular to the bisector in the rearward portion intersects the cutting edge at two locations spaced by unequal distances D2, D3 from the bisector B. A shorter one D3 of the unequal distances extends from the bisector B to the third portion 25 of the cutting edge.

Figure 4:
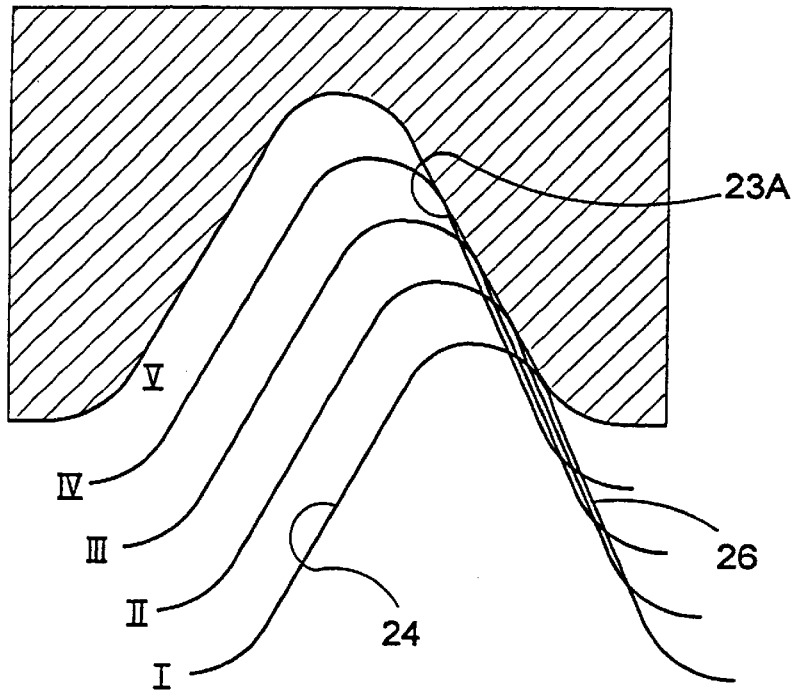
FIG. 4 shows a threading period of five passes with the tip of the threading insert.
Figure 5:
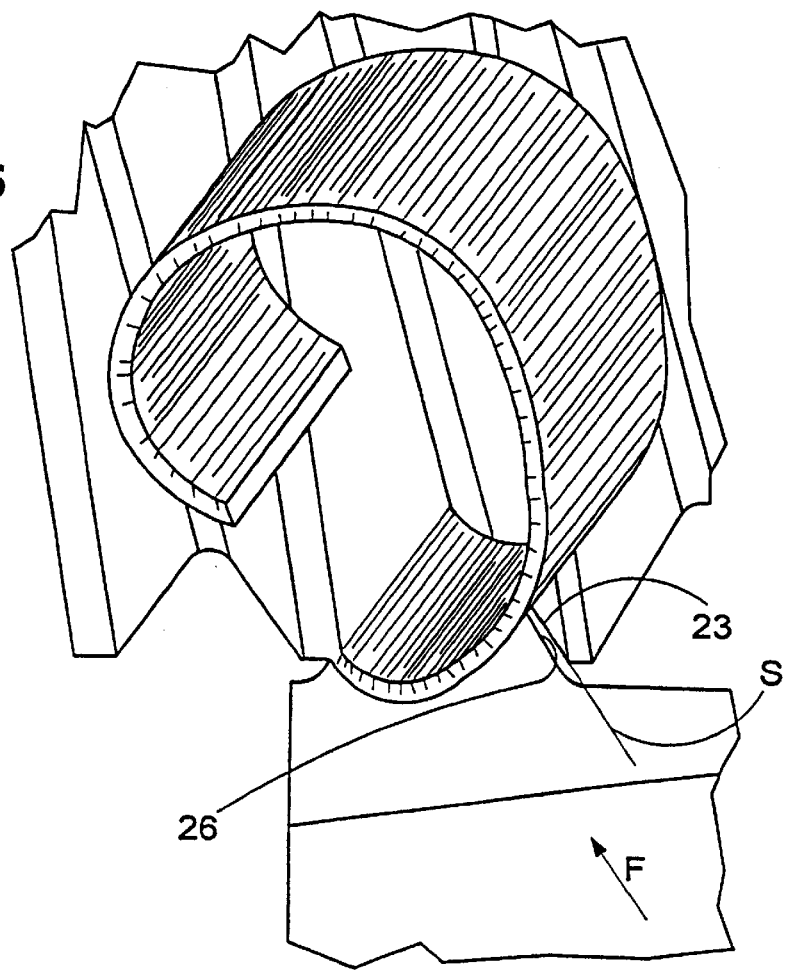
FIG. 5 shows the tip of the threading insert in engagement with a work piece.

The function of the cutting insert shall be explained closer hereinafter in connection with FIGS. 4 and 5, which show flank infeed without modification by additional tilting. In the first pass I, substantially the entire nose edge 25 of the cutting tip is brought, radially into the work piece a predetermined depth (the depth of the infeed), which separates from radial infeed only through the axial placement. The depth of the infeed is smaller than or the same as said distance $L_2$ to avoid poor surface quality on the passive thread flank. Before pass II is commenced, the cutting insert is moved in the direction of the arrow F obliquely inwardly toward the rotational axis of the work piece, parallel to the thread flank 23A. The passive cutting edge 26 thereby becomes cleared from the thread flank in the direction of infeed such that abrasion is avoided. Same will apply for the passes III to V. At the last pass V the thread also will be topped. The flank infeed is thus performed in the direction F, obliquely relative to the rotational axis of the work piece and parallel with one thread flank of the thread and a part 26 of the cutting tip is cleared from the thread flank in the direction F of the flank infeed.

This cutting insert allows considerably larger depth of infeed per pass since unnecessary friction is avoided. This means in turn that the number of passes can be essentially reduced; for example from the conventional 8 passes to 5 passes at cutting a thread M12. Thereby reduced time for processing is attained and more details can consequently be made per shift.

Figure 6:
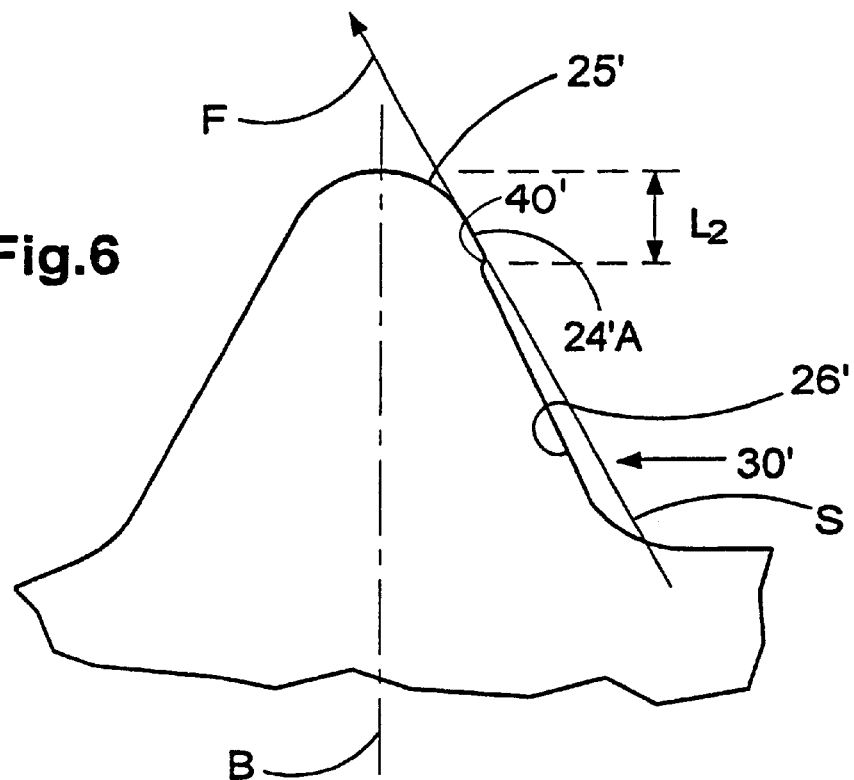
FIGS. 6 and 7 show alternative embodiments of cutting corners on threading inserts according to the present invention.
Figure 7:
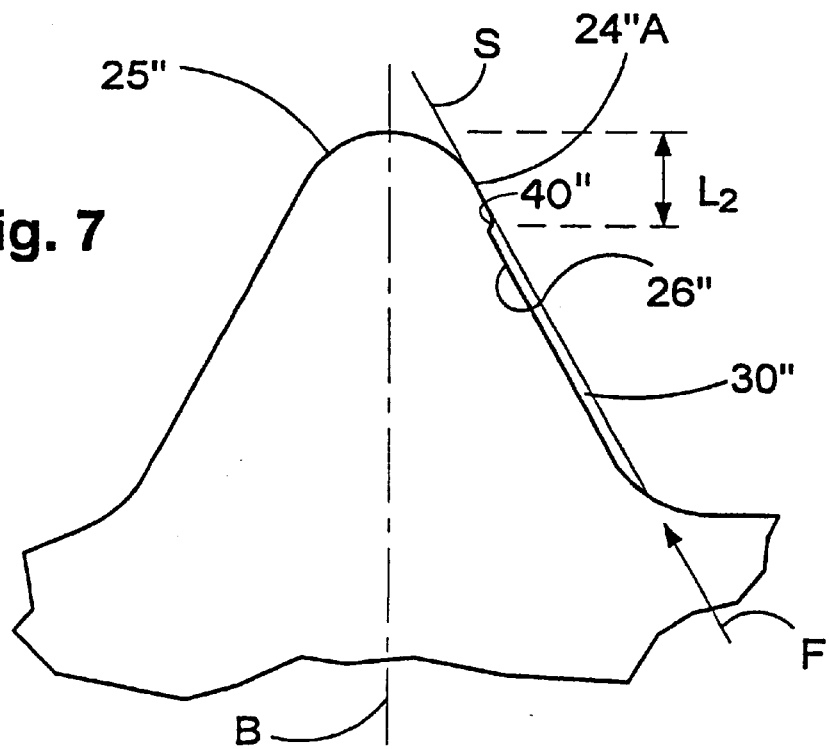
Figure 10:
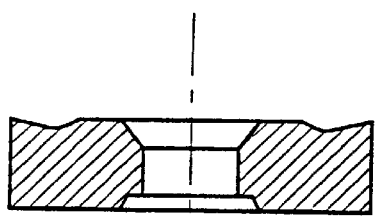
FIGS. 10 and 11 show cross sections of the cutting inserts in FIGS. 8 and 9, respectively.
Figure 11:
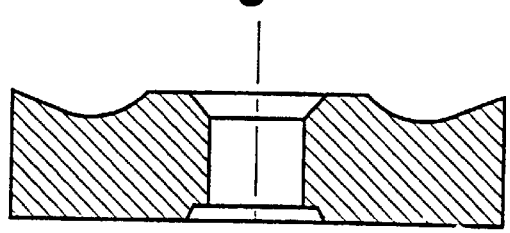
Figure 8:
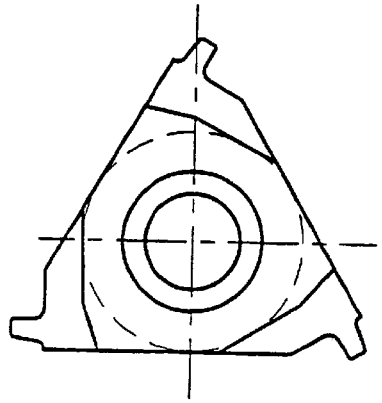
FIGS. 8 and 9 show alternative embodiments of threading inserts for trapezoidal threads, according to the present invention.

With reference to FIGS. 6 and 7 cutting inserts are shown, the passive edge 26' respective 26" of which is provided with a clearance by a recess 30' and a skew chamfer 30", respectively, to form a step 40' r 40". The recess preferably extends from the minor cutting edge 24'A at the distance $L_2$ to the radiussed bridge at the connected topping edge. The recess preferably extends from the passive cutting edge to the lower side 12 of the cutting insert. The passive cutting edge may be parallel with the generated thread flank or may form an angle with said flank, such as in FIG. 5. The chamfer 30" preferably extends from the minor cutting edge 24"A at the distance $L_2$ to the radiussed bridge at connected topping edge. The chamfer form an obtuse inner angle with the connected clearance surface 20, said angle preferably being larger than 160°. The chamfer provides clearance for the passive cutting edge when the cutting insert is mounted leaning in the cutting insert pocket. Both passive cutting edges 26' and 26" form an angle with the bisector B, which is smaller than the above mentioned angle α, which is defined by the relation between the bisector and the major cutting edge and the minor cutting edge, respectively.

In FIGS. 6 and 7, an intersection between the nose edge 25' or 25" with the passive cutting edge 26' or 26" forms a step 40' or 40" projecting toward the bisector.

FIGS. 8 to 12 show threading insert for cutting trapezoidal threads, wherein the cutting tip comprises a cutting edge. The cutting edge consists of a number of segments and includes an active major cutting edge 124, a nose edge 125, a minor cutting edge 124A, a passive edge 126 and a topping edge 127. The major cutting edge and the minor cutting edge each form an angle of about 15° with the bisector B. The nose edge is preferably perpendicular to the bisector. The passive cutting edge may be parallel with the bisector or be angled relative to the bisector, such as in FIG. 3, or recessed such as in FIG. 6; the most important in this connection is that the passive cutting edge is provided inside the line S such that the cutting edge does not engage with the connected thread flank. The passive cutting edge 126 thus can be provided with clearance by means of a recess, said recess extending from the minor cutting edge 1 24A to a radiussed bridge at the connected topping edge and the recess then extends preferably from the passive cutting edge to the lower side of the cutting insert. Alternatively the passive cutting edge can be provided with clearance by a chamfer, said chamfer extending from the minor cutting edge 124A to a radiussed bridge at the connected topping edge, wherein the chamfer forms an obtuse inner angle with the connected clearance surface.

For all above-mentioned cutting inserts the major cutting edge is substantially uniform with one, connected, generated thread flank and the passive cutting edge is substantially non-uniform with the other, connected, generated thread flank as well as the distance $L_2$ is bigger than or the same as the maximum depth of the infeed for the cutting tip per pass.

The present invention consequently relates to a threading insert wherein for example a clearance angle of about 5° is provided in the tool's minor cutting edge side, whereas full profile is provided only on the major cutting edge side and substantially on outermost point of the tip. Advantages following such a configuration are that lower cutting forces (about 40% lower) arise in comparison with a conventional cutting insert with a symmetrical cutting tip and that the number of passes can be reduced from for example 8 down to 5 passes for an ISO-profile 2.0 mm. That gives shorter threading periods and more details per cutting edge. The chip surfaces of the cutting inserts may be provided with recesses and/or projections in order to improve chip forming and in certain cases improve heat deduction.

I claim:

1. A threading insert adapted to form a thread in a workpiece, comprising a body; a cutting tip projecting forwardly from the body and having a cutting edge; a bisector of the cutting tip intersecting a front end of the cutting tip; a first portion of the cutting edge disposed to a first side of the bisector and adapted to cut one thread flank in the workpiece; a second portion of the cutting edge disposed to a second side of the bisector and adapted to cut another thread flank in the workpiece; the second portion forming a first acute angle with the bisector; a third portion of the cutting edge extending rearwardly from an intersection with a rear end of the first portion and being recessed inwardly toward the second portion with respect to a imaginary reference line which extends from the rear end of the first portion and forms a second acute angle with the bisector that is equal to the first acute angle, a first line extending perpendicular to the bisector and passing through the intersection between the first and third portions dividing the cutting tip into forward and rearward portions, whereby a second line oriented perpendicular to the bisector in the forward portion intersects the cutting edge at two locations spaced by equal distances from the bisector, and a third line oriented perpendicular to the bisector in the rearward portion intersects the cutting edge at two locations spaced by unequal distances from the bisector, with a shorter of the unequal distances extending from the bisector to the third portion of the cutting edge.

2. The threading insert according to claim 1 wherein the acute angle constitutes a first acute angle; the third portion forming a second acute angle with the bisector which is smaller than the first acute angle.

3. The threading insert according to claim 2 wherein the second acute angle is 4° to 8° smaller than the first acute angle.

4. The threading insert according to claim 2 wherein the second acute angle is 5° smaller than the first acute angle.

5. The threading insert according to claim 1 wherein the first portion defines the front end of the cutting tip and is defined by a radius to assume a convex shape; a center of the radius lying on the bisector at a location between the first and second portions of the cutting edge; a forward end of the third portion being spaced by a first distance from the front end of the cutting tip in a direction parallel to the bisector; the first distance being less than one half of the total distance of the cutting tip.

6. The threading insert according to claim 1 wherein the first portion defines the front end of the cutting tip and is defined by a radius to assume a convex shape; a center of the radius lying on the bisector at a location between the first and second portions of the cutting edge; the second portion defining an active cutting edge which smoothly connects to the first portion.

7. The threading insert according to claim 6 wherein the cutting edge includes a topping edge portion connected to a rear end of the third portion by a concave edge.

8. The threading insert according to claim 1 wherein the acute angle is from about 25° to 30°; the first portion being of convex shape and defined by a radius of from about 0.05 to 1.5 mm; a center of the radius lying on the bisector at a location between the first and second portions of the cutting edge; a distance from the front end of the cutting tip to a rear end of the first portion in a direction parallel to the bisector being less than 2.5 mm.

9. The threading insert according to claim 8 wherein the distance is substantially the same as the radius.

10. The threading insert according to claim 7 wherein the radius of the first portion is smaller than a radius of the curved edge.

11. The threading insert according to claim 1 wherein the third portion is defined by a chamfer of the cutting tip.

12. A threading insert adapted to form a thread in a workpiece, comprising a body; a cutting tip projecting forwardly from the body and having a cutting edge; a bisector of the cutting tip intersecting a front end of the cutting tip; a first portion of the cutting edge disposed to a first side of the bisector and adapted to cut one thread flank in the workpiece; a second portion of the cutting edge disposed to a second side of the bisector adapted to cut another thread flank in the workpiece; the second portion forming a first acute angle with the bisector; a third portion of the cutting edge extending rearwardly from a rear end of the first portion and being recessed inwardly toward the second portion with respect to an imaginary reference line which extends from the rear end of the first portion and forms a second acute angle with the bisector that is equal to the first acute angle, wherein an intersection between the first and third portions forms a step extending toward the bisector.

* * * * *